(«12») United States Patent
Schroeter

(10) Patent No.: US 9,958,478 B2
(45) Date of Patent: May 1, 2018

(54) SWITCHING APPARATUS FOR ELECTRICAL CONTACT TESTING

(75) Inventor: Klaus Schroeter, Berlin (DE)

(73) Assignee: ASMAG-Holding GmbH, Gruenau im Almtal (AT)

( * ) Notice: Subject to any disclaimer, the term of this patent is extended or adjusted under 35 U.S.C. 154(b) by 1584 days.

(21) Appl. No.: 12/998,287

(22) PCT Filed: Oct. 7, 2009

(86) PCT No.: PCT/AT2009/000387
§ 371 (c)(1),
(2), (4) Date: Jun. 1, 2011

(87) PCT Pub. No.: WO2010/040161
PCT Pub. Date: Apr. 15, 2010

(65) Prior Publication Data
US 2011/0241721 A1 Oct. 6, 2011

(30) Foreign Application Priority Data
Oct. 7, 2008 (AT) ................................ A 1569/2008

(51) Int. Cl.
*G01R 31/28* (2006.01)
*G01R 1/07* (2006.01)

(52) U.S. Cl.
CPC .......... *G01R 1/071* (2013.01); *G01R 31/2808* (2013.01)

(58) Field of Classification Search
CPC ..... G01R 1/071; G01R 31/309; G01R 31/311
See application file for complete search history.

(56) References Cited

U.S. PATENT DOCUMENTS 4,600,878 A * 7/1986 Doemens ............. G01R 31/024
324/514
4,777,432 A 10/1988 Doemens et al.
(Continued)

FOREIGN PATENT DOCUMENTS

DE 200 22 261 8/2001
EP 0 218 058 4/1987
(Continued)

OTHER PUBLICATIONS

International Search Report of PCT/AT2009/000387, dated May 3, 2010.

*Primary Examiner* — Tung X Nguyen
*Assistant Examiner* — Adam Clarke

(57) ABSTRACT

The invention relates to a switching apparatus (1) for conducting electrical contact tests on bare and assembled printed circuit boards (12), comprising at least a flat support layer (2), a first electrode arrangement (3) and a functional layer (4), which support layer (2) is elastically restorably deformable, and the functional layer (4) is disposed on top of the first electrode arrangement (3). The functional layer (4) is made from at least one of the group comprising a layer of a photosensitive material (7), a quantum detector and a photoresistor, and at least one source for electromagnetic radiation (8) is additionally disposed above the functional layer (7), and the emitted electromagnetic radiation predominantly acts in the direction of the functional layer (4). The functional layer (4) may also be provided in the form of a transistor arrangement (9) made up of a plurality of transistors. The invention further relates to a method of producing a switching apparatus (1).

22 Claims, 3 Drawing Sheets

(56) References Cited

U.S. PATENT DOCUMENTS

| | | | |
|---|---|---|---|
| 5,177,437 A | 1/1993 | Henley | |
| 5,357,194 A | 10/1994 | Ullman et al. | |
| 5,680,056 A | 10/1997 | Ito et al. | |
| 7,129,720 B2 | 10/2006 | Stengel | |
| 7,615,787 B2* | 11/2009 | Ouchi | G01J 3/0256 257/76 |
| 2001/0043076 A1* | 11/2001 | Itasaka | G01R 1/0408 324/750.23 |
| 2002/0167330 A1 | 11/2002 | Doi | |
| 2003/0184328 A1* | 10/2003 | Lee | B82Y 20/00 324/754.23 |
| 2006/0279297 A1* | 12/2006 | Nystrom | G01R 19/0061 324/754.24 |
| 2008/0042558 A1* | 2/2008 | Buchhauser | H01L 27/3225 313/504 |
| 2010/0181554 A1* | 7/2010 | Yoshida | H01L 51/5209 257/40 |
| 2010/0283499 A1* | 11/2010 | Bourdreau | G01R 31/2808 324/754.21 |
| 2011/0227117 A1* | 9/2011 | Verschuren | H01L 51/5271 257/98 |
| 2011/0318851 A1* | 12/2011 | Godo | G01R 31/2625 438/17 |

FOREIGN PATENT DOCUMENTS

| | | |
|---|---|---|
| EP | 1 317 674 | 6/2006 |
| JP | 61-253860 A | 11/1986 |
| JP | 6-167538 A | 6/1994 |
| JP | 2000-65883 A | 3/2000 |

* cited by examiner

SWITCHING APPARATUS FOR ELECTRICAL CONTACT TESTING

CROSS REFERENCE TO RELATED APPLICATIONS

This application is the National Stage of PCT/AT2009/000387 filed on Oct. 7, 2009 which claims priority under 35 U.S.C. § 119 of Austrian Application No. A 1569/2008 filed on Oct. 7, 2008, the disclosure of which is incorporated by reference. The international application under PCT article 21(2) was not published in English.

The invention relates to a switching apparatus for conducting electrical contact tests on bare and assembled printed circuit boards, comprising at least a flat support layer, a first electrode arrangement and a functional layer, which support layer is elastically restorably deformable, and the functional layer is disposed on the first electrode arrangement. The invention further relates to a method of producing such a switching apparatus.

Printed circuit boards are preferably used to assemble electronic circuits, on which electronic units and components are mounted in subsequent work steps. Printed circuit boards are preferably made up of a support layer and conductor tracks applied on top. Since the reliability of the electrical connections of the printed circuit board is crucial to the function for which the electronic circuit is designed, every printed circuit board is tested for its electrical conductivity after the production process. In particular, the conductivity of every individual connecting line as well as the contacts is tested.

To this end, methods are known from the prior art whereby a test adapter is provided with a plurality of longitudinally displaceable, spring-biased contact needles. The layout of the contact needles on the test adapter is selected so that it corresponds to the points of the printed circuit board to be tested. This specifically means that it is necessary to make up a separate test adapter for every printed circuit board to be tested. During testing, the test adapter is pressed against the printed circuit board so that the spring-biased testing needles apply sufficient contact pressure and thus establish a reliable electrical contact with the conductor track to be tested.

However, the contact pressure needed for this purpose represents a major drawback of the known methods because it can cause damage and in particular also destroy the conductor track being tested. Given that the electronic components used to build electronic circuits are becoming increasingly integrated, it is necessary to accommodate an increasingly large number of connecting lines on the printed circuit board, which means that the conductor tracks are becoming increasingly thin and hence more sensitive to mechanical stress. The contact pressure needed to establish the electrical connection to the testing needles may then be enough to damage or destroy the conductor tracks.

Other test apparatuses are known, whereby at least two testing needles are provided which can be positioned in the plane of the printed circuit board surface in a controlled manner. The testing needles are selectively positioned above the conductor track to be tested by means of a coordinate positioning device, after which the testing needles are pressed onto the conductor track and the continuity between the measurement points is measured. The advantage of this design is that it is possible to run test procedures which can be individually configured because there is no need for a test adapter with fixed testing needles. However, this design also poses the same problem because the contact pressure needed for the testing needles can damage or destroy the conductor track being tested.

Another major disadvantage of the known methods is the fact that printed circuits and printed conductor tracks cannot be reliably tested using test adapters and testing needles because the conductor track would not survive the test undamaged due to the very thin layer thicknesses and the materials, which have little mechanical resistance.

Document EP 1 317 674 B1 discloses a testing device for testing printed circuit boards for their functionality, whereby the support layer of the test adapter is made from a flexible photoconductive polymer film. As disclosed by the document, a photoconductive layer is applied directly onto at least one side of the printed circuit board. The photoconductive layer is electrically isolating but is electrically conductive in a locally restricted area when illuminated by a laser beam. In order to conduct the test, an electric voltage is applied to the electrodes mounted on the photoconductive layer and the two end points of the conductor track are illuminated by means of a laser beam. In particular, the photoconductive layer placed over the printed circuit board is illuminated as a result. The laser beam is selectively deflected from a laser source via several mirrors to enable areas on the printed circuit board to be selectively illuminated. As a result of the illumination, the photoconductive layer becomes electrically conductive in the illuminated area, and the current flowing there can then be evaluated as an indicator that the conductor track is functional. The disadvantage of this approach is that it is necessary to provide a laser source, which then requires a complex deflector system, in particular a plurality of mirrors, which can be exactly activated. Another disadvantage is the fact that the photoconductive layer lies directly on the conductor tracks of the printed circuit board. Due to inaccuracies in the illumination by the laser beam or control effects, a situation may arise in which a larger area of the photoconductive layer is illuminated and thus becomes electrically conductive, which can then cause contacting with adjacent conductor tracks.

The objective of the invention is to improve the known test device, making it possible to determine the quality of the connecting line, in particular the conductivity, by means of an integrated test apparatus.

The objective of the invention is achieved due to the fact that the functional layer is made from at least one of the group comprising a layer of a photosensitive material, a quantum detector and a photoresistor, and at least one source for electromagnetic radiation is disposed above the functional layer, and the emitted electromagnetic radiation acts predominantly in the direction of the functional layer. The advantage of this design is that the functional layer is illuminated and hence an electrical contact established between the conductor track and the electrode arrangement directly by the contact device itself In particular, no external lamp means and complex deflector system is needed to establish an electrical contact, thereby resulting in a compact design. Another advantage is the fact that the source for electromagnetic radiation is very close to the photosensitive material, which means that a very accurately definable area is illuminated, thereby reducing the risk of undesired illumination of adjacent areas.

The advantage of the claimed functional layer is that it is not electrically conductive without or with only weak illumination and becomes electrically conductive in the illuminated area when illuminated with light of an appropriate wavelength and intensity. Of particular advantage is the fact that when the area is not being illuminated, it remains electrically isolating. Being non-conductive without illumination, the functional layer specifically ensures that no short circuit can occur with the printed circuit board being tested at the first electrode arrangement.

The photosensitive material may be provided in the form of an organic semiconducting material, for example poly(p-phenyl-vinyl) (PPV). However, it is also possible to use inorganic semiconducting materials, for example Hg-selenide or Cd-sulfide, in which case the crystal size and hence the quantum-specific absorption rate can be adjusted by influencing the production parameters.

The objective of the invention is also achieved due to the fact that the functional layer is provided in the form of a transistor arrangement made up of a plurality of transistors. A transistor is a controllable semiconductor component, which enables the flow of current through the component to be specifically controlled in particular. In addition to enabling a pure continuity measurement, this advantageous property also makes it possible to define the quality of the connecting line, in other words determine the electrical conductivity.

By contrast with known devices, the fact that the flow of current can be specifically controlled means that a test can be conducted on already assembled printed circuit boards and semiconductor wafers. If electronic components have already been mounted on a printed circuit board, in particular semiconductor components, these could be damaged by an uncontrolled flow of current. By specifically controlling the flow of current without the need for an external controllable power source, testing can be conducted without posing any risk to the components. The fact that contact is advantageously made in a particularly gentle manner means that even extremely sensitive semiconductor wafers can be tested.

A support layer made from an organic material offers a particular advantage in that the switching apparatus proposed by the invention can be produced particularly inexpensively and efficiently. However, this design offers a further advantage because both the manufacture and the disposal or waste processing of the claimed contact device results in significantly fewer problems in terms of environmental pollution. It is preferable to opt for a design based on a plastic film which can be supplied on rolls, for example, thereby resulting in particularly rational production of the switching apparatus.

The support layer is made from polyethylene terephthalate (PET) or polyethylene naphthalate PEN), for example, and the skilled person will be familiar with other plastics which may be used to make the support layer based on the claimed design.

It is also of advantage if the support layer is of an electrically isolating design because electrically conductive components of the switching apparatus can be mounted directly on the support layer if necessary without the need for additional work steps and isolating layers.

A transparent or semi-transparent support layer is of advantage in terms of monitoring or logging the contact testing operation. This offers the option of being able to control the conductor tracks of the printed circuit board visually during the electrical contact testing operation or inspect printed features such as text to ensure that they are correct. Furthermore, illumination of the source for electromagnetic radiation can also be monitored and logged so that a visual record of the contact tests can be produced and the functionality of the radiation sources constantly monitored.

A transparent or semi-transparent support layer offers a further advantage in that the electromagnetic radiation emitted by the source also still acts on the functional layer, by reference to the area in which the source is active, when the support layer is disposed between the source and functional layer.

Based on another embodiment, the first electrode arrangement comprises at least one electrically conductive electrode, and a design based on a strip-type electrode is particularly preferred.

Also of advantage is a design whereby the first electrode arrangement is disposed on a flat face of the support layer. Since the support layer is elastically restorably deformable, the claimed electrode arrangement can be optimally adapted to the surface structure of the printed circuit board to be contacted. This is of particular advantage when testing a printed circuit board that has already been assembled.

The skilled person will be aware that deformations must remain within the threshold values specific to the material, in other words pronounced deformation must not lead to irreversible damage to the material.

Based on another claimed embodiment, a second electrode arrangement is provided, comprising at least one electrically conducting electrode. This design makes for a compact, integrated arrangement or design of the switching apparatus proposed by the invention. Again in this instance, it is also particularly preferable to use a strip-type electrode because the width of the strip-type electrode can be adjusted to the desired resolution capacity.

In a preferred embodiment, the strip-type electrodes of the first electrode arrangement and the strip-type electrodes of the second electrode arrangement are disposed so that the strip-type electrodes are rotated with respect to one another in the plane of their longitudinal extension, preferably by 90°. As a result of this design, a dotted-like coverage of the first and second electrode arrangement is obtained.

Since the second electrode arrangement is disposed on the functional layer, it is possible to set up a selective arrangement of electrical switching points. In particular, the electrode arrangements are disposed so that the functional layer is disposed between the first and second electrode arrangement and is in electrical contact with them respectively, at least in certain areas. This ensures that both a quantum detector and a transistor of the transistor arrangement are in electrical contact with at least one electrode of the first and second electrode arrangements, for example.

It is of particular advantage if the electrode of the first and/or the electrode of the second electrode arrangement is connected via an electrically isolated connecting line to a terminal area. The advantage of this design is that standardized and hence universally deployable connecting means can be used to establish the electrical connection of the switching apparatus to an evaluation device, for example. Since all the connecting lines needed to conduct the contacting test are disposed in one terminal area, it is possible to opt for a modular approach and in particular this design will lend itself to a simple and rapid exchange of switching apparatus.

Based on one embodiment, the at least one electrode of the first and/or second electrode arrangement is transparent or semi-transparent. As a result of this advantageous design, an electrically conducting contacting of the functional layer can be obtained whilst simultaneously enabling a visual inspection of and access to electromagnetic radiation. The electrodes are preferably made from indium tin oxide (ITO), although it is also possible to use all the materials from the group comprising Transparent and Conductive Oxides (TCO), familiar to the person skilled in the art.

A particularly advantageous embodiment is obtained if electrically conducting contact points are provided on the second electrode arrangement or on the functional layer. Due to these contact points, a defined contacting with the printed circuit board is guaranteed, thereby preventing any unintentional contacting of an adjacent conductor track, for example.

In one advantageous embodiment, it is possible to set up a simple connection tester whereby the contact points are disposed directly on the functional layer. By selectively activating the radiation source respectively the transistor arrangement, those areas of the functional layer whose contact points contact the end points of the conductor track being tested can be rendered electrically conducting so that the electrical contact can be tested by detecting the flow of current.

An electrically isolating layer may optionally be applied to the functional layer or second electrode arrangement so that it is only possible to establish an electrically conductive contact of the switching apparatus to the object being tested via the contact points.

Since a plurality of connecting lines is usually connected to the terminal area, one design is particularly practical whereby the terminal area has an electronic multi-way switch, provided in the form of an array of transistors for example. An electronic multi-way switch is able to control a plurality of input lines to one output line in a selectively controlled manner, thereby drastically reducing the number of lines needed to connect the switching apparatus to the outside, for example to an evaluation unit. With a view to adopting a modular approach to the switching apparatus and also with a view to making the switching apparatus proposed by the invention suitable for universal use, this design represents a particularly advantageous embodiment.

Also view a view to adopting a modular approach and ensuring that the switching apparatus proposed by the invention can be used universally, another design is of advantage in which the terminal area has a connecting means which can be coupled. This design enables the switching apparatus to be changed rapidly, which is of particular advantage in automated facilities for producing printed circuit boards. Also of advantage is the fact that the connecting means used for coupling purposes may be a connecting means known from the prior art, which can advantageously be used universally and in a broad range of applications. For example, plug-in connectors may be used such as those used for electrically contacting printed circuit boards.

A design in which the source for electromagnetic radiation is provided in the form of an organic semiconductor component, in particular an oLED, offers the very specific advantage that a considerable cost saving can be made in manufacturing the switching apparatus proposed by the invention. Also of advantage is the fact that both the production and disposal of oLEDs represents a considerably lesser threat to the environment than is the case with inorganic LEDs. Likewise of advantage is the fact that oLEDs are able to conform to the elastic deformations of the support layer without being damaged, as a result of which the switching apparatus can be better adapted to the surface structure of the conductor track.

With a view to obtaining the highest possible local resolution of the switching apparatus, it is of advantage if the source for electromagnetic radiation is provided in the form of a plurality of lamp means disposed in a structured arrangement. By using a plurality of lamp means, it is possible to position the switching apparatus on the printed circuit board to be tested without the need for complex equipment and then selectively activate the appropriate test points, for example. Based on one embodiment, the position of the printed circuit board relative to the switching apparatus can be detected by means of an optical recording device for example, thereby enabling the relevant contacting points to be determined.

Also of advantage is the fact that by activating the lamp means accordingly, several contacting measurements can also be taken simultaneously.

Another particularly advantageous embodiment is obtained if the transistor arrangement is provided in the form of organic transistors because these transistors are able to conform to the deformations of the support layer without being damaged, which makes for particularly effective adaptation to the surface of the printed circuit board. The transistors are preferably organic field effect transistors (FET), the advantage of which is that they can be used as very low-loss switches on the one hand and constitute a very exactly controllable power source on the other hand.

Also of advantage is an embodiment in which a plurality of transistors in the transistor arrangement is disposed in a structured arrangement. As a result of this design, a high number or a high density of test contact points can be set up and in particular several contact tests can be conducted simultaneously if necessary.

The objective of the invention also includes a method of producing a flexible switching apparatus, which comprises the following steps:

applying a first electrode arrangement to a flat face of a support layer;

applying a functional layer to the first electrode arrangement;

applying a second electrode arrangement to the functional layer;

applying electrically conducting contact points to the second electrode arrangement.

Based on one advantageous embodiment, the first electrode arrangement and/or the functional layer and/or the second electrode arrangement and/or the contact points are applied by a printing process. A switching apparatus produced by a printing process is advantageously particularly inexpensive to make on a rational basis, for example in a continuous process. A printing process does not require high temperature processes or special atmospheric conditions, in particular vacuum cameras. Printing process can also be adapted to a new format or a new design of the areas to be printed particularly easily and quickly.

Printed structures also tend to have a very slim layer thickness, for example in the range of a few µm, which results in a low material requirement.

Suitable printing processes include ink jet printing, screen printing, stamp printing, although the person skilled in the art will be familiar with other methods of applying liquid or pasty materials to a support layer or other layers in a structured arrangement. In particular, there are known methods of depositing such materials from a vapor or gas phase.

Based on one embodiment, the functional layer is applied by printing organic transistors, in particular organic field effect transistors. Since the functional layer is disposed between the first and second electrode arrangement, the claimed design offers an advantage in that the transistors can be printed directly onto the first electrode arrangement, thereby resulting in a compact, integrated switching apparatus.

Semiconductor components and transistors in particular are made up of a plurality of differently semiconducting layers and the component is made by running several structured printing operations. Printing processes offer the quite specific advantage that they enable structures to be produced which could otherwise not be produced in the field of inorganic semiconductors or could be so only with a great deal of difficulty and complexity. In particular, some areas can be left free during a first printing operation, on which a different semiconducting material can be printed in a second printing operation, for example. In order to produce structured inorganic semiconductors, it is necessary to run a plurality of vapor deposition steps followed by photolithographic structuring processes.

Also of advantage is an embodiment whereby the functional layer is formed by applying a photosensitive material, and organic light emitting diodes (oLEDs) can be printed onto the photosensitive. Since the oLEDs are applied to the photosensitive material, it is possible to obtain a very accurate demarcation of the area to be illuminated, the advantage of this being that any unintentional illumination of a neighboring area can be avoided.

In one embodiment, however, the oLEDs may also be printed onto the second flat face of the support layer.

Based on one embodiment, the electrodes of the first and/or second electrode arrangement are obtained by printing connecting lines that are electrically isolated from one another to a terminal area.

The invention will be explained in more detail below with reference to examples of embodiments illustrated in the appended drawings. To keep the diagrams simple, some of the hatching indicating cut surfaces is omitted from the drawings.

The drawings are schematically simplified diagrams illustrating the following:

Figure 1:
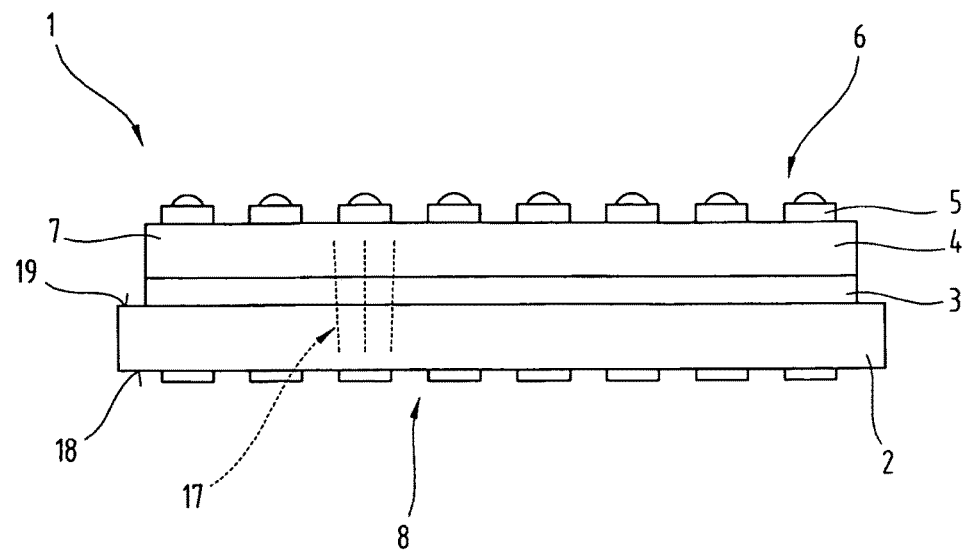
FIG. 1 shows the switching apparatus proposed by the invention based on a first embodiment.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described. Individual features or combinations of features from the different embodiments illustrated and described may be construed as independent inventive solutions or solutions proposed by the invention in their own right.

FIG. 1 illustrates a switching apparatus 1 proposed by the invention comprising a support layer 2, a first electrode arrangement 3, a functional layer 4, a second electrode arrangement 5 as well as contact points 6 and sources for electromagnetic radiation 8.

The first electrode arrangement 3 is provided in the form of a plurality of strip-type electrodes, for example, and is disposed on the first flat face 19 of the support layer 2. Applied on top of the first electrode arrangement 3 is a layer of a photosensitive material, for example inorganic semiconductor, as well as organic semiconductors such as poly (p-phenyl-vinyl (PPV). Applied on top of the functional layer 4 is the second electrode arrangement 5, which may be provided in the form of a plurality of strip-type electrodes, and the electrodes of the first electrode arrangement and the electrodes of the second electrode arrangement are disposed in the plane of their longitudinal direction in a rotated arrangement with respect to one another, preferably by 90°. Disposed on the electrodes of the second electrode arrangement 5 are electrically conducting contact points 6. By means of these contact points, an electrically conducting contact is established between the conductor track to be tested and the switching apparatus. The photosensitive material 7 is rendered electrically conductive in the illuminated area by illuminating it with a light of the appropriate wavelength and intensity and thus establishes an electrically conductive contact between at least one electrode of the first electrode arrangement 3 and at least one contact point 6 or one electrode of the second electrode arrangement 5. Areas of the photosensitive material 7 are illuminated by means of radiation sources 8, which are preferably disposed on the second flat face 18 of the support layer 2. When a radiation source 8 is electrically activated, it emits a light beam 17 which penetrates the transparent support layer 2 and the transparent or semi-transparent electrodes of the first electrode arrangement 3 and acts on the photosensitive material 7. The photosensitive material is electrically conducting in the illuminated area and thus establishes an electrically conducting connection between an electrode of the first electrode arrangement 3 and an electrode of the second electrode arrangement 5 or a contact point 6. The radiation sources 8 are preferably provided in the form of organic light emitting diodes (oLEDs) which are printed onto the second flat face 18 of the support layer 2.

In the case of one embodiment, the oLEDs may also be printed directly onto the photosensitive layer, however, the advantage of which is that the support layer and the electrodes of the first electrode arrangement do not have to be transparent.

The conductivity of a conductor track is measured by applying a voltage to an electrode of the first electrode arrangement 3, for example, and the lamp means 8 disposed above the contact point 6 which is in electrical contact with a first end of the conductor track to be tested is activated. The electrode of the second electrode arrangement 5 whose contact point 6 is in electrical contact with the second end of the conductor track to be tested is checked for an electrical current flow, which serves as the criterion for a functional conductor track. The two contact points must clearly not lie on the same electrode of the second electrode arrangement. A design of this type enables several conductor tracks to be tested simultaneously without the measurements being mutually affected by selecting the conductor tracks accordingly, in other words specifically activating the electrodes of the first electrode arrangement.

Since the switching apparatus 1 based on one embodiment is transparent or semi-transparent, another advantage obtained is the fact that the switching apparatus does not impair visual detection of the conductor tracks on the printed circuit board. This means that is possible to undertake a visual inspection of the printed circuit board at the same time as the electrical contact test is being run, for example with a view to ascertaining the quality and positioning accuracy of the print.

In one embodiment, the contact points 6 may also be applied directly onto the functional layer. Such a design is used by preference when testing conductor tracks, the second end of which is disposed not on the flat face of the flat face contacted by the contact point 6, these being through-connecting conductor tracks or multi-layered conductor tracks.

The individual layers and the oLEDs in particular are preferably printed, for example by means of an ink jet printing process. Without wishing to impose any restriction, however, they may also be applied by means of screen printing or deposition from the vapor phase.

Figure 2:
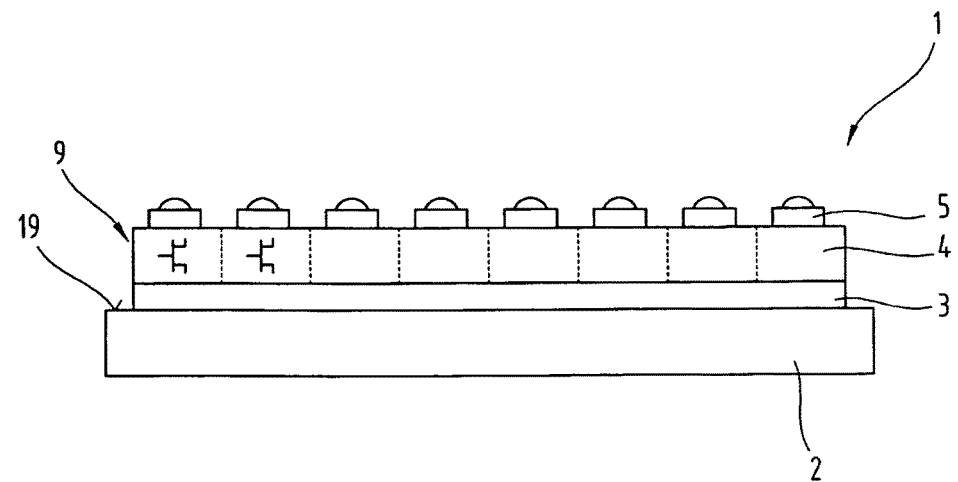
FIG. 2 shows the switching apparatus proposed by the invention based on a second embodiment.

FIG. 2 illustrates another embodiment of the flexible switching apparatus proposed by the invention, in which the functional layer 4 is provided in the form of a transistor arrangement 9. Applied to the first flat face 19 of a support layer 2 is a first electrode arrangement 3, and onto this is applied a plurality of transistors, in particular organic field effect transistors (FET). Applied on top of the transistor arrangement 9 is the second electrode arrangement 5 and on top of it the electrically conducting contact points 6. Since this design does not operate on the basis of light acting on a photosensitive layer, it is not necessary for the support layer and electrode arrangements to be transparent or semi-transparent.

Operation is the same as that described in connection with FIG. 1, the difference being that the electrically conducting connection of an electrode of the first electrode arrangement 3 to the contact point 6 or to an electrode of the second electrode arrangement 5 is switched and controlled by means of a transistor activated accordingly. The advantage of a transistor is that it has very low through-resistance in the switched state and the current can be specifically adjusted by the transistor, which is of particular advantage in terms of the accuracy of the measurement.

The individual layers and the transistor arrangement in particular are preferably applied by known methods, in the same way as described above in connection with FIG. 1.

Figure 3:
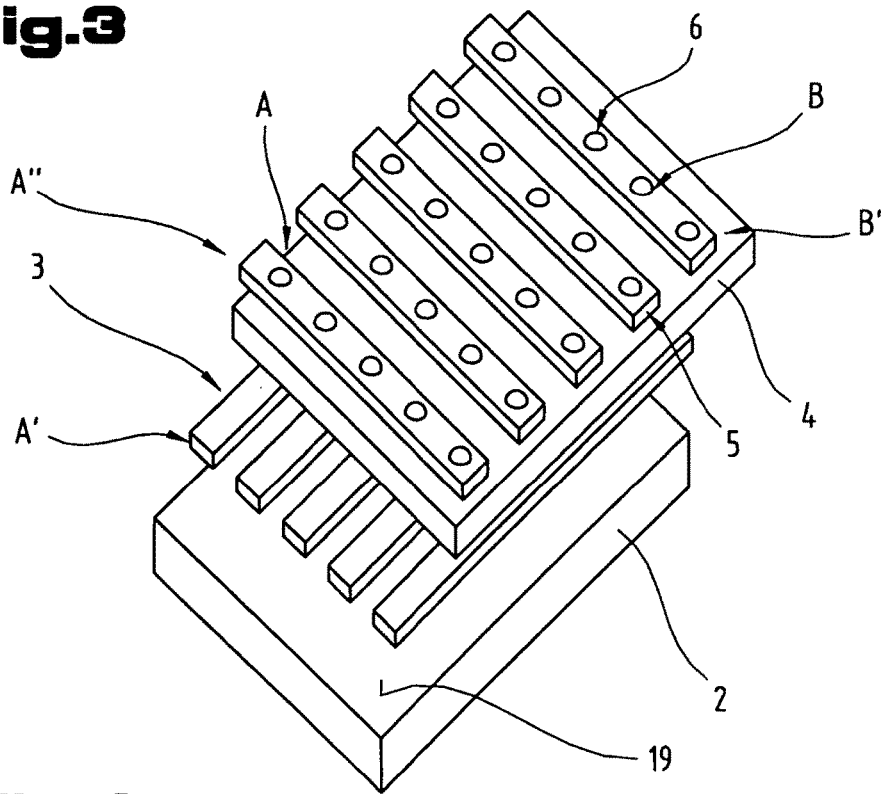
FIG. 3 is an exploded diagram illustrating the layout of the individual layers.

FIG. 3 is an exploded diagram illustrating the layout of the individual layers of the switching apparatus 1. Applied to the first flat face 19 of the support layer 2 is the first electrode arrangement 3 made up of strip-type electrodes applied by a printing process. Applied on top of the first electrode arrangement 3 is the functional layer 4 and based on one embodiment, a photosensitive material is applied, whereas in another embodiment, a plurality of transistors is applied for the transistor arrangement, preferably by printing. Electrodes, in particular strip-type electrodes, of the second electrode arrangement 5 may optionally be applied on top of the functional layer. Applied on top of the electrodes of the second electrode arrangement 5 are electrically conducting contact points 6, and these contact points may optionally also be applied on top of the functional layer.

The strip-type electrodes of the first 3 respectively second 5 electrode arrangement are rotated with respect to one another, preferably by 90°, and a contact point 6 is disposed in the imaginary overlapping area in each case. This design enables activation or querying of the individual contact points in a lattice pattern. Accordingly, one electrode of the first electrode arrangement is activated in alternation with all of the electrodes of the second electrode arrangement. This operation is repeated for all the electrodes of the first electrode arrangement. By activating a lamp means or by switching a transistor, an area of the functional layer is rendered conductive and an electrically conducting connection of the electrode A' to contact point A is established in the area of contact point A. By querying electrode B', it can be unambiguously ascertained whether the conductor track between points A and B is electrically conducting.

In one embodiment, however, it would also be possible for all of the electrodes of the second electrode arrangement 5 to be queried with the exception of electrode A″, in order to pinpoint a faulty point in the conductor track covering layer for example or alternatively a short circuit of the conductor track with a second conductor track.

Figure 4:
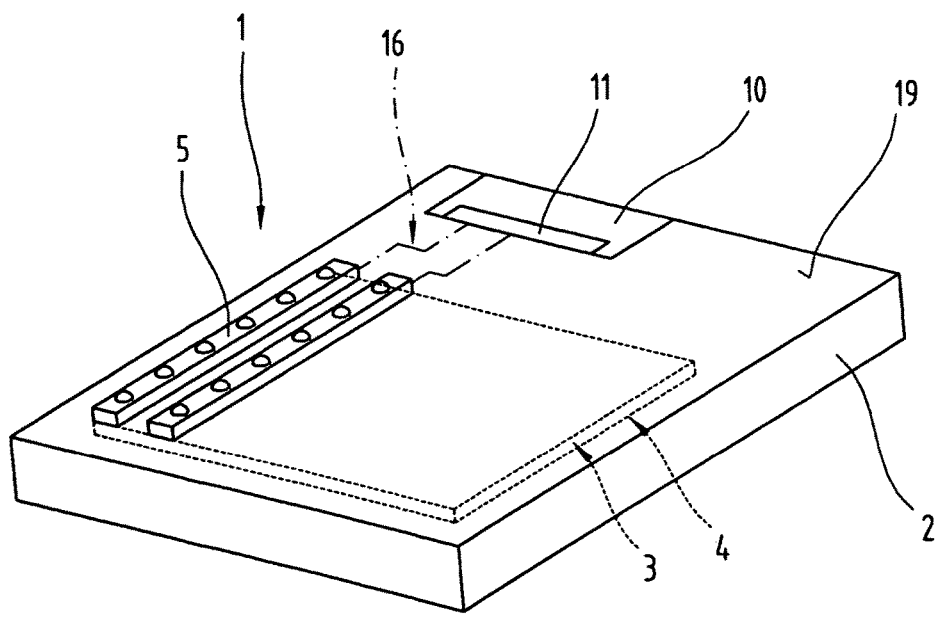
FIG. 4 shows the switching apparatus proposed by the invention incorporating a terminal area.

FIG. 4 illustrates the switching apparatus 1 proposed by the invention with the electrodes of the first 3 and optionally second 5 electrode arrangement connected via connecting lines 16 electrically isolated from one another to a terminal area 10. In order to keep the diagram simple, the electrodes and the individual layers are illustrated on a schematic basis only. In particular, applied to the first flat face 19 of the support layer are the first electrode arrangement 3, the functional layer 4 as well as the second electrode arrangement 5. To avoid having to run all the connecting lines 16 of the electrodes from the switching apparatus 1 to an evaluation device, not illustrated, an electronic multi-way switch 11 is provided in the terminal area 10. The purpose of this multi-way switch is to connect a plurality of input lines to one or a few output lines on a selectively controlled basis. This multi-way switch, in particular a so-called multiplexer, is activated on a selective basis and then connects the electrodes co-operating with the contact points to be tested to a connecting means in the terminal area 10.

Based on one advantageous embodiment, this multiplexer is provided in the form of organic semiconductor components, for example a transistor matrix, and is printed directly onto the support layer by means of a printing process.

Figure 5A:
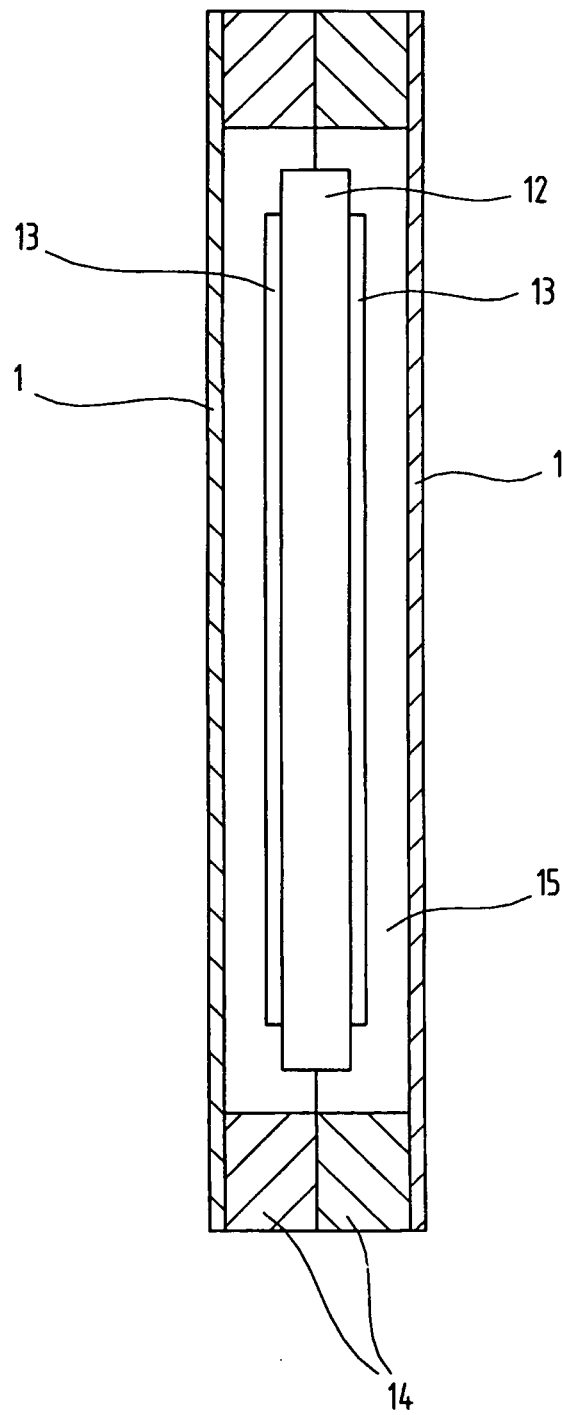
FIG. 5 illustrates an arrangement for conducting a contact test on a printed circuit board.
Figure 5B:
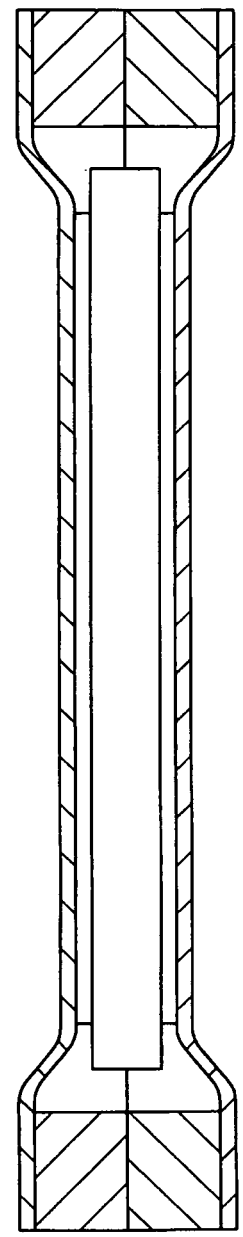

FIG. 5A illustrates a device for running an electrical contact test on printed circuit boards. On a double-sided printed circuit board 12, conductor tracks 13 are applied to each flat face. A switching apparatus 1 is disposed on a frame 14 and two such frames 14 completely surround the printed circuit board 12 to be tested so that a closed air gap 15 is created between the switching apparatus 1 and the printed circuit board 12. In order to establish an electrical contact between the conductor tracks 13 and the contact points of the switching apparatus, a negative pressure is generated in the air gap 15, as a result of which the flexible switching apparatus 1 conforms to the surface structure of the printed circuit board 12, as illustrated in FIG. 5B.

The way the conductivity measurement is taken has already been described and this will not be repeated here. Since the support layer is of an elastically and reboundably deformable design, it can be adapted to the surface of the printed circuit board to be tested in a particularly effective way. In particular, components may have already been mounted on the printed circuit board but essentially will not hinder testing of the printed circuit board because the switching apparatus can be adapted to the surface structure.

The switching apparatus proposed by the invention may be specifically designed for a plurality of different testing arrangements and the testing apparatus can be easily and rapidly adapted to a different type of printed circuit board 12 to be tested by changing the frame 14. Since the switching apparatus preferably has a connecting means which can be coupled, the electrical connection can also be easily and rapidly adapted to a different switching apparatus.

In particular, the switching apparatus proposed by the invention offers significantly increased flexibility with respect to the possible test situations.

All the figures relating to ranges of values in the description should be construed as meaning that they include any and all part-ranges, in which case, for example, the range of 1 to 10 should be understood as including all part-ranges starting from the lower limit of 1 to the upper limit of 10, i.e.

all part-ranges starting with a lower limit of 1 or more and ending with an upper limit of 10 or less, e.g. 1 to 1.7, or 3.2 to 8.1 or 5.5 to 10.

The embodiments illustrated as examples represent possible variants of the switching apparatus, and it should be pointed out at this stage that the invention is not specifically limited to the variants specifically illustrated, and instead the individual variants may be used in different combinations with one another and these possible variations lie within the reach of the person skilled in this technical field given the disclosed technical teaching. Accordingly, all conceivable variants which can be obtained by combining individual details of the variants described and illustrated are possible and fall within the scope of the invention.

FIG. 2 illustrates another embodiment of the switching apparatus which may be construed as an individual solution in its own right, the same reference numbers and component names being used to denote parts that are the same as those described in connection with FIG. 1 above. To avoid unnecessary repetition, reference may be made to the detailed description given in connection with FIG. 1 above.

For the sake of good order, finally, it should be pointed out that, in order to provide a clearer understanding of the structure of the switching apparatus, it and its constituent parts are illustrated to a certain extent out of scale and/or on an enlarged scale and/or on a reduced scale.

The objective underlying the independent inventive solutions may be found in the description.

Above all, the individual embodiments of the subject matter illustrated in FIGS. 1 to 5 constitute independent solutions proposed by the invention in their own right. The objectives and associated solutions proposed by the invention may be found in the detailed descriptions of these drawings.

LIST OF REFERENCE NUMBERS

1 Contacting device, switching apparatus
2 Support layer
3 First electrode arrangement
4 Functional layer
5 Second electrode arrangement
6 Contact point
7 Photosensitive material
8 Source for electromagnetic radiation
9 Transistor arrangement
10 Terminal area
11 Electronic multi-way switch
12 Printed circuit board
13 Conductor tracks
14 Frame
15 Closed air gap
16 Connecting lines
17 Light beam
18 Second flat face
19 First flat face

The invention claimed is:

1. Switching apparatus for conducting electrical contact tests on bare or assembled printed circuit boards, comprising
at least a flat support layer with a first flat face and a second flat face, the support layer being elastically restorably deformable,
a first electrode arrangement,
one single functional layer, the single functional layer being disposed on the first flat face, and
a plurality of sources of electromagnetic radiation, the plurality of sources being disposed on the second flat face above the single functional layer and emitting electromagnetic radiation, the electromagnetic radiation acting predominantly in a direction of the single functional layer,
wherein the single functional layer is disposed on the first electrode arrangement,
wherein the single functional layer is made from at least one of the group comprising a layer of a photosensitive material, a quantum detector and a photoresistor,
wherein the sources of electromagnetic radiation are provided in the form of respective organic semiconductor components, in particular oLEDs,
wherein the sources of electromagnetic radiation are configured to illuminate areas of the single functional layer, and
wherein the single functional layer is configured to be rendered electrically conductive in an illuminated area.

2. Switching apparatus according to claim 1, wherein the support layer is made from an organic material.

3. Switching apparatus according to claim 1, wherein the support layer is of an electrically isolating design.

4. Switching apparatus according to claim 1, wherein the support layer is transparent or semi-transparent.

5. Switching apparatus according to claim 1, wherein the first electrode arrangement comprises at least one electrically conductive electrode, in particular a strip-type electrode.

6. Switching apparatus according to claim 1, wherein the first electrode arrangement is disposed on a flat face of the support layer.

7. Switching apparatus according to claim 1, wherein a second electrode arrangement is additionally provided, which is provided in the form of at least one electrically conductive electrode, in particular a strip-type electrode.

8. Switching apparatus according to claim 7, wherein the second electrode arrangement is disposed on the single functional layer.

9. Switching apparatus according to claim 7, wherein the electrode of the first and/or second electrode arrangement is connected by an electrically isolated connecting line to a terminal area.

10. Switching apparatus according to claim 7, wherein the at least one electrode of the first and/or second electrode arrangement is transparent or semi-transparent.

11. Switching apparatus according to claim 7, wherein electrically conducting contact points are disposed on the second electrode arrangement or on the single functional layer.

12. Switching apparatus according to claim 1, wherein the electrode of the first electrode arrangement is connected by an electrically isolated connecting line to a terminal area, and
wherein the terminal area has an electronic multi-way switch.

13. Switching apparatus according to claim 1, wherein the electrode of the first electrode arrangement is connected by an electrically isolated connecting line to a terminal area, and
wherein the terminal area has a connector which can be coupled.

14. Switching apparatus according to claim 1, wherein the sources of electromagnetic radiation are provided in the form of a plurality of lamps disposed in a structured arrangement.

15. Method of producing a switching apparatus according to claim 1, comprising the steps of:

applying a first electrode arrangement to a flat face of a support layer;

applying a single functional layer to the first electrode arrangement;

applying a second electrode arrangement to the single functional layer; and applying electrically conducting contact points to the second electrode arrangement.

16. Method according to claim 15, wherein the first electrode arrangement and/or the single functional layer and/or the second electrode arrangement and/or the contact points are applied via a printing process.

17. Method according to claim 15, wherein the single functional layer is formed by printing organic transistors, in particular field effect transistors.

18. Method according to claim 15, wherein the single functional layer is formed by applying a photosensitive material and organic light emitting diodes (oLEDs) are printed onto the photosensitive material.

19. Method according to claim 15, wherein the electrodes of the first and/or second electrode arrangement are connected to a terminal area by printing connecting lines electrically isolated from one another.

20. Switching apparatus for conducting electrical contact tests on bare and assembled printed circuit boards comprising at least a flat support layer, the support layer being elastically restorably deformable, a first electrode arrangement and one single functional layer, the single functional layer being disposed on the first electrode arrangement, wherein the single functional layer is provided in the form of a transistor arrangement made up of a plurality of organic field effect transistors (FET), and wherein the single functional layer is configured to be rendered conductive in an area by switching an organic field effect transistor.

21. Switching apparatus according to claim 20, wherein the transistor arrangement is provided in the form of organic transistors.

22. Switching apparatus according to claim 21, wherein a plurality of transistors of the transistor arrangement is disposed in a structured arrangement.

* * * * *